(12) United States Patent
Elian et al.

(10) Patent No.: US 9,164,156 B2
(45) Date of Patent: Oct. 20, 2015

(54) APPARATUS HAVING A BACK-BIAS MAGNET AND A SEMICONDUCTOR CHIP ELEMENT

(71) Applicant: Infineon Technologies AG, Neubiberg (DE)

(72) Inventors: Klaus Elian, Alteglofsheim (DE); Georg Ernst, Thalmassing (DE); Horst Theuss, Wenzenbach (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 322 days.

(21) Appl. No.: 13/629,659

(22) Filed: Sep. 28, 2012

(65) Prior Publication Data

US 2013/0082340 A1    Apr. 4, 2013

(30) Foreign Application Priority Data

Sep. 30, 2011    (DE) .......................... 10 2011 114 773

(51) Int. Cl.
| | |
|---|---|
| *G01R 33/02* | (2006.01) |
| *G01R 33/06* | (2006.01) |
| *G01R 33/07* | (2006.01) |
| *G01R 33/09* | (2006.01) |
| *G01D 5/14*  | (2006.01) |

(52) U.S. Cl.
CPC ............ *G01R 33/072* (2013.01); *G01R 33/091* (2013.01); *G01D 5/147* (2013.01); *G01R 33/06* (2013.01)

(58) Field of Classification Search
CPC ... G01R 33/0011; G01R 33/091; G01R 33/07
USPC .................................................. 324/251, 252
See application file for complete search history.

(56) References Cited

U.S. PATENT DOCUMENTS

| | | | |
|---|---|---|---|
| 8,253,210 B2 * | 8/2012 | Theuss et al. ................. | 257/421 |
| 2009/0295381 A1 | 12/2009 | Theuss et al. | |
| 2010/0276769 A1 | 11/2010 | Theuss et al. | |

FOREIGN PATENT DOCUMENTS

| | | |
|---|---|---|
| DE | 102010016726 A1 | 11/2010 |
| JP |     11261131 A   | 9/1999 |
| JP |     2010237217 A | 10/2010 |

OTHER PUBLICATIONS

English Abstract JP 2010237217 A; Oct. 21, 2010.
English Abstract JP 11261131 A; Sep. 24, 1999.

* cited by examiner

*Primary Examiner* — Reena Aurora

(57) ABSTRACT

An apparatus may include a back-bias magnet; and a semiconductor chip element; wherein the semiconductor chip element has a sensor for measuring a magnetic field strength; and wherein a contact surface is formed on a contact side of the back-bias magnet and on a contact side of the semiconductor chip element and wherein the contact side of the semiconductor chip element has one or more structures such that the contact surface of the back-bias magnet is shaped in a manner corresponding to the structures of the semiconductor chip element.

15 Claims, 3 Drawing Sheets

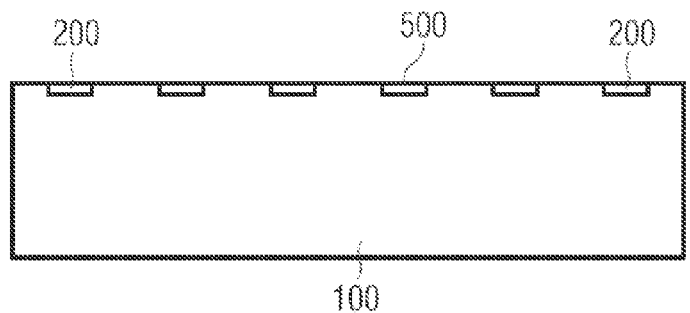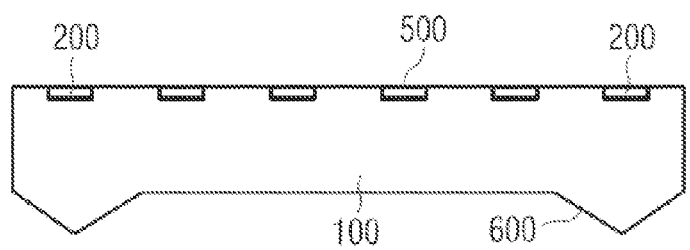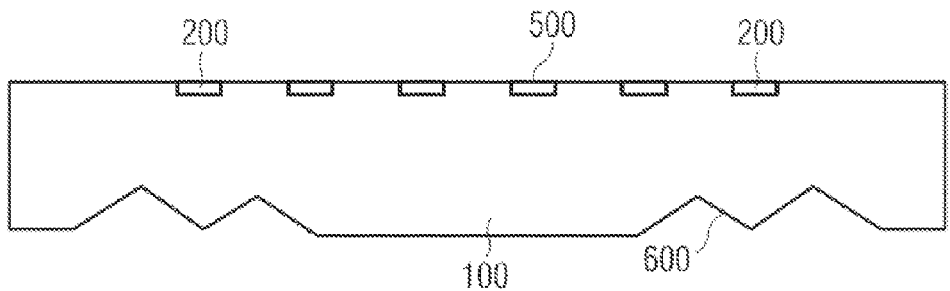

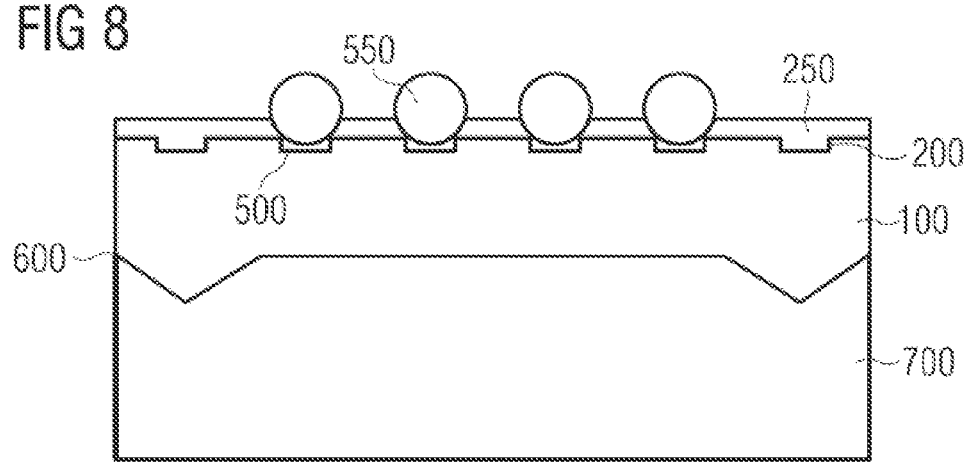
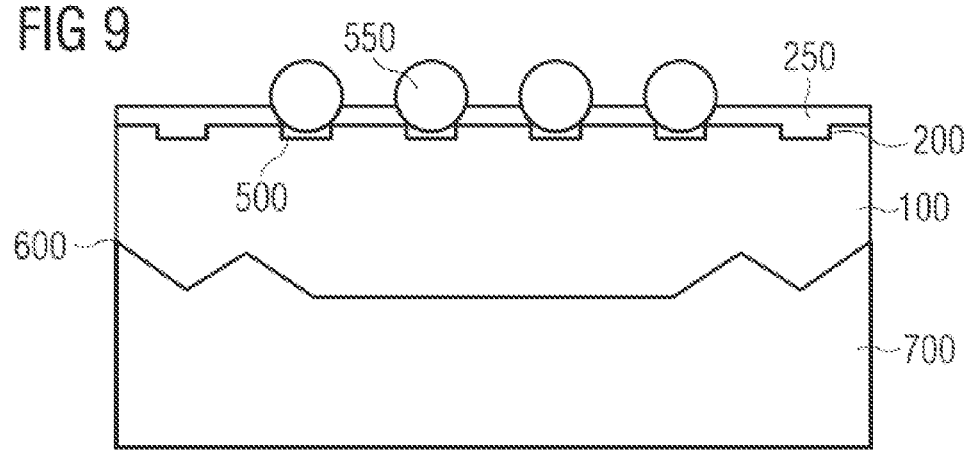
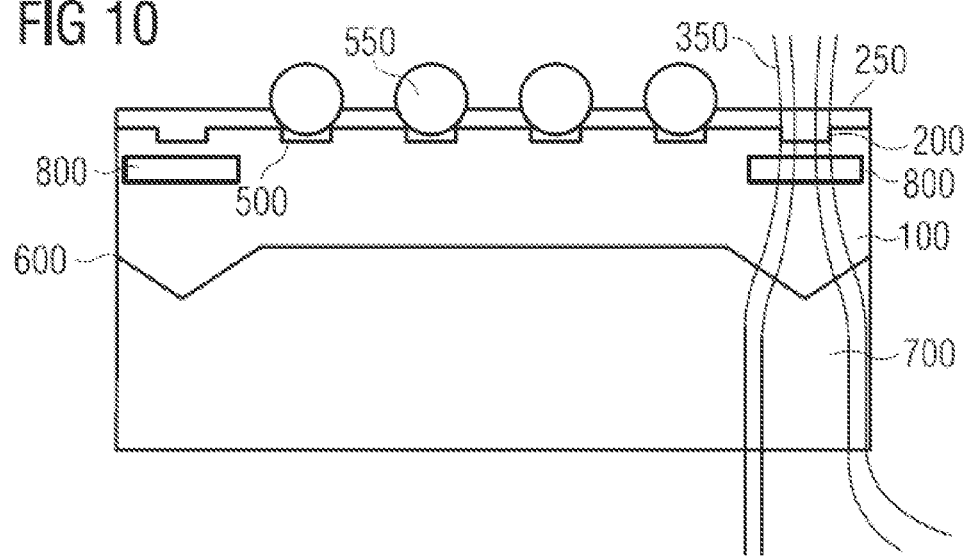

APPARATUS HAVING A BACK-BIAS MAGNET AND A SEMICONDUCTOR CHIP ELEMENT

CROSS-REFERENCE TO RELATED APPLICATION

This application claims priority to German Patent Application Serial No. 10 2011 114 773.3, which was filed Sep. 30, 2011, and is incorporated herein by reference in its entirety.

BACKGROUND

Magnetic field sensors nowadays typically contain a semiconductor chip and may, moreover, include a magnet which is oriented such that it directs magnetic field lines through a section to be captured of the chip or magnetizes magnetizable elements such as for example elements of a polar wheel. Such magnets are also known as back-bias magnets. Magnetic field sensors having back-bias magnets are used for example as position sensors or rate of rotation sensors but also for other capturing processes of magnetic fields.

One example of a magnetic field sensor contains a chip sensor attached to a system carrier. In some cases, only the chip sensor is supplied to a customer, who positions the chip sensor between a permanent magnet and a movable component such as for example a gear wheel. It is possible that the customer may bend the system carrier in order to position the chip sensor in a preferred orientation. Apart from the preferred orientation, during use it may nevertheless be difficult to realize a desired magnetic field direction, for example a perpendicular magnetic field penetration for a GMR sensor, through the chip sensor. Both of the abovementioned aspects related to the use of conventional magnetic field sensors are undesirable.

Another example of a magnetic field sensor includes a chip sensor package that is positioned relative to a multi-pole magnetic gear wheel. In this case, the gear wheel provides the magnetic field. Such multi-pole magnetic gear wheels are complex and expensive, and the chip sensor package is still subject to the undesirable limitations mentioned above.

SUMMARY

An apparatus may include a back-bias magnet; and a semiconductor chip element; wherein the semiconductor chip element has a sensor for measuring a magnetic field strength; and wherein a contact surface is formed on a contact side of the back-bias magnet and on a contact side of the semiconductor chip element and wherein the contact side of the semiconductor chip element has one or more structures such that the contact surface of the back-bias magnet is shaped in a manner corresponding to the structures of the semiconductor chip element.

BRIEF DESCRIPTION OF THE DRAWINGS

The appended drawings are incorporated so as to convey a better understanding of embodiments, and are incorporated in this specification and constitute part thereof. The drawings illustrate embodiments and serve, together with the description, for the explanation of principles of embodiments. Other embodiments and many of the intended advantages of embodiments can be readily understood if they are appreciated better by reference to the following detailed description. The elements of the drawings are not necessarily to scale relative to one another. Identical reference numerals designate corresponding similar parts.

FIGS. 5 to 10 show different sections and variants of a production method according to various embodiments.

DETAILED DESCRIPTION

Figure 1:
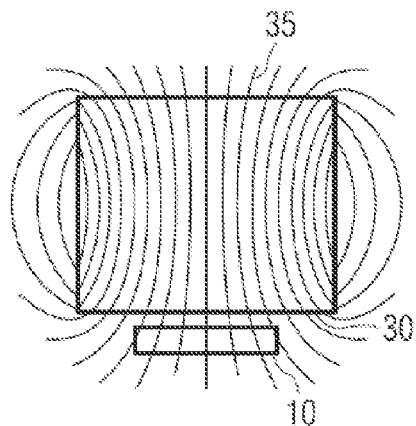
FIG. 1 shows a schematic cross-sectional view of a back-bias magnet with magnetic field lines and a sensor.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

In the following Detailed Description, reference is made to the accompanying drawings, which form a part hereof, and in which are shown by way of illustration specific embodiments in which the invention may be practiced. In this regard, directional terminology, such as "top," "bottom," "front side," "rear side," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be understood in a limiting sense, and the scope of the present invention is defined by the appended claims.

It is to be understood that the features of the various exemplary embodiments described herein may be combined with each other, unless specifically noted otherwise.

While a particular feature or aspect of one embodiment may be disclosed with respect to only one of several implementations, such a feature or aspect may in addition be combined with one or more other features or aspects of the other implementations as may be desired and advantageous for any given or particular application. Furthermore, to the extent that the terms "include," "have," "with," or other variants thereof are used in either the detailed description or the claims, such terms are intended to be inclusive in a manner similar to the term "comprise." The terms "coupled" and "connected," along with derivatives may be used. It should be understood that these terms may be used to indicate that two elements cooperate or interact with each other regardless of whether they are in direct physical or electrical contact, or they are not in direct contact with each other. Also, the term "exemplary" is merely meant as an example, rather than the best or optimal. The following detailed description, therefore, is not to be understood in a limiting sense, and the scope of the present invention is defined by the appended claims.

Various embodiments provide a highly integrated apparatus which can be produced cost-effectively.

One aspect provides an apparatus which contains the following: a back-bias magnet, a semiconductor chip element, wherein the semiconductor chip element has a sensor for measuring a magnetic field strength and wherein a contact surface is formed on a contact side of the back-bias magnet and on a contact side of the semiconductor chip element and wherein the contact side of the semiconductor chip element has one or more structures such that the contact surface of the back-bias magnet is shaped in a manner corresponding to the structures of the semiconductor chip element.

The above apparatus makes it possible, by providing one or more structures in the semiconductor chip element on the contact side with the back-bias magnet, for the contact surface of the back-bias magnet to be formed in a manner corresponding to the structures on the contact side of the semiconductor chip element. As a result, structures of the back-bias magnet on the contact surface can be formed in a manner corresponding to the structures in the semiconductor chip element that define or influence the magnetic field generated by the back-bias magnet. Owing to the direct contact, very exact positioning of the structures responsible for shaping the back-bias magnetic field can be achieved. This in turn is the reason that magnetic field sensors having back-bias magnets with a very reproducible setting of the magnetic field can be produced using such a production method. Said apparatus can here be produced with few production steps and can thus also be produced very cost-effectively.

The semiconductor chip element can be a single semiconductor chip, a stack of a plurality of semiconductor chips or a composite system of a semiconductor chip element with an element provided in addition to the semiconductor chip. The contact surface of the semiconductor chip element can here be a semiconductor material surface, i.e. for example the semiconductor material surface of a rear side of a semiconductor chip. In embodiments it is furthermore possible for an additional layer to be provided on the rear side of the semiconductor chip, wherein the one or more structures are provided partially or completely in the additional layer. Here, the contact surface of the semiconductor chip element can thus consist of the material of the additional layer, which may have a semiconductor material or a material other than a semiconductor material. In the embodiment of a compound system, the contact surface of the semiconductor chip element can be the surface of the element provided in addition to the semiconductor chip.

In one embodiment, it is furthermore possible for the apparatus to have a semiconductor chip, wherein the side of the semiconductor chip facing the back-bias magnet has further structures and wherein the further structures of the semiconductor chip and the structures of the back-bias magnet are configured such that they engage in one another and the semiconductor chip and the back-bias magnet are connected fixedly to each other by way of the contact surface. As a result it is possible to avoid or at least greatly reduce for example the delamination of various layers and to thus increase the quality and lifetime.

In one embodiment, the back-bias magnet of the apparatus may have a magnetizable or magnetic injection material, for example plastic-bonded injection material, which has particles with magnetizable or magnetic material. Plastic-bonded injection material can be procured simply and cost-effectively and be very easily processed for example in an injection molding method. In this exemplary embodiment, the structures created in the semiconductor chip element on a side are covered with the magnetizable or magnetic injection material, wherein the injection material during the molding method adapts to the structures in the semiconductor chip element such that, after curing, a shape of the back-bias magnet is formed that corresponds to the one or more structures in the semiconductor chip element. In other words, the structures created in the semiconductor chip element on the contact side constitute a template or mold, which causes the back-bias magnet on the contact side with the semiconductor chip element to be formed in a manner corresponding to the mold.

In one embodiment, the structures of the semiconductor chip element can be formed by etching. Etching of semiconductors both in a dry etching method and in a wet etching method is cost-effective and quickly realizable.

In another embodiment, the magnetic field lines of the apparatus generated by the back-bias magnet can be settable by shaping the structures of the semiconductor chip element. As a result, the magnetic field lines can be set flexibly and for example be set exactly in accordance with the position of a sensor.

In one embodiment, the magnetic or magnetizable material, for example magnetic or magnetizable injection material, of the apparatus can have permanent-magnetic particles, soft-magnetic particles or hard-magnetic particles. Owing to the fact that differently magnetizable particles are used, it is possible for the apparatus to be set ideally in respect of the desirable magnetic properties of the back-bias magnet.

In another embodiment, the apparatus can have a plurality of external contact elements in electrical connection with the sensor.

In one embodiment, the semiconductor chip element of the apparatus can be contactable using wire bonds or solder beads. Contacting using wire or solder bead can be realized particularly easily and is also cost-effective. When using solder beads, the apparatus can be packed for example in what is referred to as BGA packages or eWLB packages. A particularly compact construction is thus realizable.

In one embodiment, the sensor is a GMR sensor, wherein the back-bias magnet sets a working point of the GMR sensor. The sensor, however, may also include other types of magnetic sensor, for example a Hall sensor or a magnetoresistance sensor, such as for example a CMR sensor (Colossal Magneto resistance Sensor) or AMR sensor. Different sensors can be used, depending on the requirement of the magnetic field to be measured. The apparatus is thus easily and flexibly adaptable to the measuring task.

In one embodiment, the apparatus has a magnetic lens, wherein the magnetic lens is configured to amplify the magnetic field lines generated by the back-bias magnet. With the use of magnetic lenses it is possible for the field strength generated by a magnet to be increased, and thus the measurement accuracy and measurement sensitivity of the sensor increase. Even weak magnetic fields and small changes in the magnetic field can thus be detected.

According to one embodiment, a method for producing an apparatus has the following steps: a semiconductor chip element is provided, wherein the semiconductor chip element has a sensor for measuring a magnetic field strength; and wherein one or more structures are formed on a contact side of the semiconductor chip element; and a back-bias magnet is generated such that a contact surface is formed on a contact side of the back-bias magnet and on a contact side of the semiconductor chip element such that the contact surface of the back-bias magnet is shaped in a manner corresponding to the structures of the semiconductor chip element.

The back-bias magnet may for example be produced by way of injecting a compound onto the contact side of the semiconductor chip element. The semiconductor chip element may furthermore initially be arranged on a wafer, wherein it is singulated from the wafer before the back-bias magnet is produced.

The production of the one or more structures may include for example removal of material on a contact side of the semiconductor chip element.

A structure for defining the singulation may be formed in embodiments at least partially by the one or more structures on the contact side of the semiconductor chip element.

Furthermore, it is possible, together with the removal of material for forming the one or more structures, for a further structure for defining a singulation edge to be produced.

In embodiments, a magnetic lens may be arranged between the sensor and the one or more structures.

The embodiments of fabricating such semiconductor chip elements may use various types of semiconductor chip elements or semiconductor substrates. Here, the semiconductor chip elements can have, in addition to a sensor for measuring a magnetic field strength, also other elements, among them logic integrated circuits, analog integrated circuits, mixed signal integrated circuits, sensor circuits, MEMS (Micro Electro Mechanical Systems), power integrated circuits, elements with integrated passives, elements with discrete passives and so on. The semiconductor chip element in embodiments may for example be a single semiconductor chip, a semiconductor chip with additional layer or additional carrier, a semiconductor stack or a semiconductor chip module.

In embodiments, layers can be applied to one another or materials are applied or deposited onto layers. It should be appreciated that any such terms as "applied" or "deposited" are meant to cover literally all kinds and techniques of applying a layer onto another. In one embodiment, they are meant to cover techniques in which layers are applied at once as a whole, such as, for example, laminating techniques, as well as techniques in which layers are deposited in a sequential manner, such as, for example, sputtering, plating, molding, chemical vapor deposition (CVD) and so on. One example for a layer to be applied is the redistribution layer (RDL). The redistribution layer can be in the form of a multilayer, in particular a multilayer having a repeating layer sequence.

FIG. 1 shows a schematic cross-sectional view of an exemplary known back-bias magnet 30, which generates magnetic field lines 35. A sensor 10 is located in the magnetic field 35 generated by the back-bias magnet 30 and may for example use the magnetic field generated by the back-bias magnet for setting and measuring purposes. If the sensor 10 for example has a GMR sensor element (Giant Magneto Resistance Element), it is advantageous to set a working point of the GMR element by an applied back-bias magnetic field with vertical magnetic field component. The position of the sensor 10, however, cannot be set here in an optimum fashion because only a small part of the magnetic field lines 35 pass through the sensor in perpendicular fashion. A GMR sensor element operates in an ideal manner if its working point is set such that the magnetic field lines generated by the back-bias magnet are perpendicular to the GMR sensor element.

Figure 2:
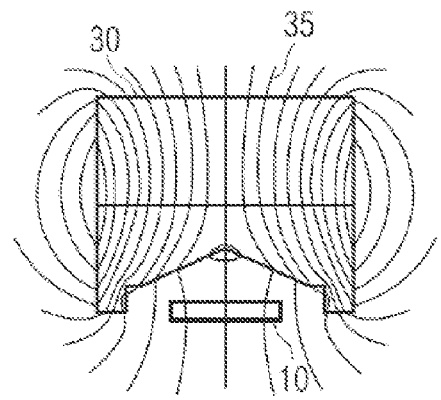
FIG. 2 shows a schematic cross-sectional view of a back-bias magnet, which is geometrically shaped, with magnetic field lines and a sensor.

FIG. 2 shows a schematic cross-sectional view of a further known back-bias magnet 30, which generates magnetic field lines 35. A sensor 10 is located within the magnetic field 35 generated by the back-bias magnet 30 and can thus measure the magnetic field generated by the back-bias magnet. The form of the back-bias magnet 30 is configured in this example such that the magnetic field lines 35 generated and shaped by the back-bias magnet extend largely perpendicular relative to the magnetic field sensor 10. As shown in FIG. 2, this can be effected by the back-bias magnet 30 having a cutout. In this way, the magnetic field sensor 10 can be set better in respect of its working point. It can thus be seen that the cutout made effects a change in the magnetic field that can be used advantageously to set a correspondingly desired magnetic field direction, for example a perpendicular direction, and/or a desired magnetic field strength.

Figure 3:
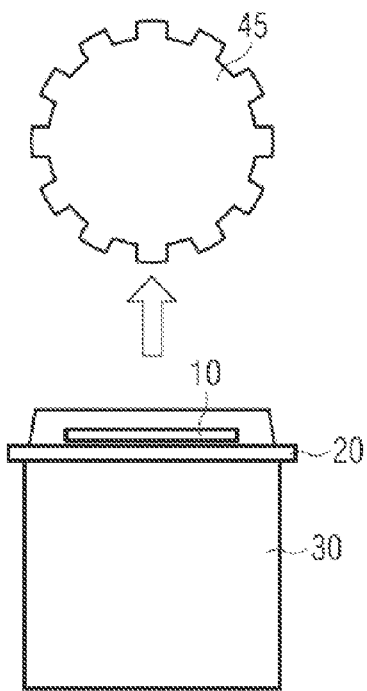
FIG. 3 shows a schematic view of a back-bias magnet with a sensor and a ferromagnetic material, wherein the sensor captures the changes in the magnetic field caused by the ferromagnetic material.

FIG. 3 shows in a schematic cross-sectional view how a magnetic sensor with back-bias magnet similar to FIG. 1 can be arranged in a measuring apparatus for capturing changes in a magnetic field. Here, movements, switch positions or rotational speeds can be captured, for example. In this example, a magnetic encoder 45, for example a multipolar wheel, is moved past the magnetic sensor 10. Known magnetic sensors are, for example, Hall sensors or magnetoresistive sensors such as AMR and GMR sensors. The magnetic sensor is mounted on a carrier 20, for example a leadframe. The magnetic sensor 10 and the carrier 20 can be encapsulated by a molding compound 40 and thus be protected against undesired influences from the outside. The back-bias magnet 30 generates a constant magnetic field. The magnetic sensor 10 thus detects the changes in a magnetic field caused by the multipolar wheel.

Figure 4:
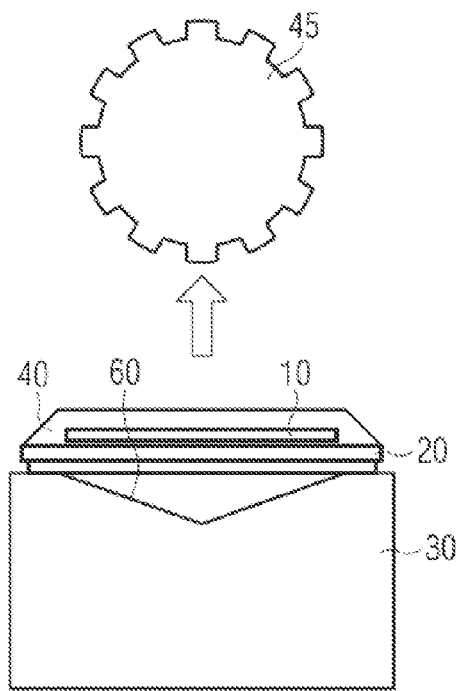
FIG. 4 shows a schematic view of a back-bias magnet, which is geometrically shaped, with a sensor and a ferromagnetic material, wherein the sensor captures the changes in the magnetic field caused by the ferromagnetic material.

FIG. 4 furthermore shows a schematic cross-sectional view of a known measuring apparatus according to the discussed measuring apparatus in FIG. 3. However, the back-bias magnet 30 has a special shape 60. Owing to the special shape 60 of the back-bias magnet 30, it is possible to shape magnetic field lines in a targeted fashion. In the case of GMR sensors it is necessary, for example, to shape the magnetic field in a targeted fashion so that the magnetic field lines travel as perpendicular relative to the magnetic sensor 10 as possible in order to set a working point for the GMR sensor. A change in the magnetic field caused by the magnetic encoder 45 can be detected with the corresponding setting by the magnetic field sensor 10.

It has now been found that the embodiments according to FIG. 2 and FIG. 4 can generate a desired magnetic field, as is necessary for example for setting the working point for a GMR sensor element, if the relative positioning matches the intended or calculated positioning. However, even small changes in this relative positioning can result in a significant deviation from the intended or calculated magnetic field distribution, such that for example a working point can no longer be set in an optimum fashion. In addition, the structure formed in the back-bias magnet can also be subject to fabrication-related fluctuations. In the fabrication process the back-bias magnetic fields are therefore subject to corresponding fluctuations, which are caused by imprecise or deviating positioning of the back-bias magnet relative to the magnetic sensor or by fabrication-related fluctuations of the magnetic-field-shaping structures themselves.

Referring to FIG. 5 to FIG. 10, embodiments of a fabrication method will now be described, which make it possible to produce a semiconductor chip element having a back-bias magnet with lower fabrication-related fluctuations of the back-bias magnetic field and little expense.

FIG. 5 shows a schematic cross-sectional view of a semiconductor chip element 100 according to an exemplary embodiment before further steps for producing a back-bias magnet are carried out. Although the semiconductor chip element 100 in FIG. 5 is illustrated as a single element, in exemplary embodiments the semiconductor chip element can also be arranged on a wafer as one of a plurality of other semiconductor chip elements. The semiconductor chip element 100 has, in addition to the chip which has for example silicon, electrical contacts 500 and at least one sensor 200 for capturing a magnetic field, which sensor is for example a GMR sensor element (Giant Magnetoresistance Element). The mode of operation of GMR sensor elements is known to the person skilled in the art and is therefore not explained in any more detail at this point. By way of the electrical contacts, the semiconductor chip element 100 is electrically contactable from the outside, and using the sensors 200 it is possible for magnetic fields and their changes to be measured.

FIG. 6 shows a schematic cross-sectional view of the semiconductor chip element 100 after a processing operation for forming structures according to one embodiment. As can be seen in FIG. 6, structures or shapes are formed on a contact side or rear side 600 of the semiconductor chip element 100. The structures can be produced for example using photo masking technology and etching. The etching process can be realized for example using dry etching (CxFyHz) or wet etching (KOH). In various embodiments, anisotropic etching methods can be used for obtaining the intended structures. Here, the structures are configured such that they serve for a back-bias magnet, which is mounted in a further step on the rear side of the semiconductor chip, quasi as a negative image.

FIG. 8 shows a schematic cross-sectional view of the embodiment shown in FIG. 6 after a back-bias magnet 700 is formed by injecting a magnetic or magnetizable molding compound. In various embodiments, in which the semiconductor chip element 100 in FIG. 5 or FIG. 6 is arranged on a wafer, it is also possible in addition for a singulation to be carried out, if appropriate. As can be seen in FIG. 8, furthermore the electrical contacts 500 were contacted using solder beads 550 in order to obtain electrical connections for example for reading sensor signals. A solder stop layer 250 or what is called an "under pump metallization pattern mask" layer 250 may also be applied on the semiconductor chip element 100, as shown in FIG. 8. This layer can serve as a stop layer for the solder beads and can further serve as a protection layer for the semiconductor chip element 100. The back-bias magnet 700 is applied as a magnetic or magnetizable molding compound 700 on the contact side 600 of the semiconductor chip element 100. Said molding compound can be applied for example by an injection molding method. Magnetized molding compounds can have, for example, mixed hard ferrite or NdFeB magnetic powders, which are embedded in thermoplastics such as for example epoxy resins and they can be processed on modified injection machines. The magnetized molding compound thus applied cures and then has the magnetic properties intended. The contact side 600 of the semiconductor chip element 100 can have here one or more structures, such that the contact surface of the back-bias magnet 700 is formed in a manner corresponding to the structures of the semiconductor chip element 100. Ideally, the structures of the back-bias magnet 700 and of the semiconductor chip element 100 are configured such that they engage in one another and the semiconductor chip element 100 and the back-bias magnet 700 are fixedly connected to each other by the contact surface on the contact side 600. For example, the structures of the semiconductor chip element 100 and of the back-bias magnet 700 are set such that the magnetic field lines generated by the back-bias magnet 700 are settable using shaping of the structures. If a GMR sensor element is provided, it is possible therewith for example for the magnetic field lines to be set such that they extend perpendicularly to the main surface of the sensor 200. It is thus possible for a sensitivity and measurement accuracy of the sensor element to be significantly improved with respect to known arrangements. The structure on the contact side 600 of the semiconductor chip element 100 shown in the embodiment of FIG. 6 or FIG. 8 has, in cross section, a convex shape, i.e. a shape which bulges outwardly. This can be for example in a three-dimensional illustration a pyramid or roof-type structure. As can be seen in FIG. 8, the contact surface of the semiconductor chip element 100 that is formed by the structure is in direct contact with the contact surface of the back-bias magnet 700 such that the contact surface of the back-bias magnet 700 traces the structure of the semiconductor chip element 100 and therefore corresponds to said structure. In other words, the structure provided in the semiconductor chip element 100 is meshed with the compound of the back-bias or leaves in the compound of the back-bias magnet 700 an impression that has the inverse or negative shape. When providing the suitable shapes, it is thus possible to effect shaping of the magnetic field of the back-bias magnet 700 in order to achieve a desired magnetic field, for example a magnetic field with vertical alignment at the location of the sensor 200.

In other embodiments, the structure can have other shapes, for example a convex structure, i.e. a shape which bulges inwardly. In further embodiments, the structure can have a concave shape and a convex shape.

FIG. 7 shows a schematic cross-sectional view of a semiconductor chip element 100 according to one embodiment, in which concave structures are formed. As already described in FIG. 6, the contact side 600 of the semiconductor chip element 100, which is for example a rear side, has structures or shapes which are produced by removing material, for example using etching, and may in this embodiment have additional depressions and/or elevations. The structures on the contact side 600 of the semiconductor chip element 100 are configured as a concave shape and are thus inverse with respect to those of FIG. 8. Specifically, the semiconductor chip element 100 has in each case two concave structures which are arranged laterally spaced apart from one another at the edge regions of the semiconductor chip element 100. In other embodiments, the semiconductor chip elements may, however, have only one concave structure or more than two concave structures. In a three-dimensional view, these structures may be shaped for example as inverse pyramids or inverse roofs.

FIG. 9 shows a schematic cross-sectional view of the apparatus with semiconductor chip element 100, as already described in FIG. 8 and the preceding figures, after it was singulated from a wafer and the back-bias magnet 700 is formed. What was explained already with reference to FIG. 8, applies here also to the embodiment in FIG. 9, except for the explanations with respect to the shape of the structure. It should be noted that during singulation, a part of the provided structures can be intended for defining the singulation edge such that any region originally defined in the wafer for the semiconductor chip element may be reduced in size at the edges. In other embodiments, it is possible for example with the same etching step for the structures also for separate singulation structures to be defined, which additionally likewise result in the singulation edge being defined. It is thus possible to achieve a synergetic effect, by using part of the structure or structures itself for defining the singulation edge or by the structures necessary therefore being able to be produced in the same production step, i.e. for example in the same etching step.

FIG. 10 shows a schematic cross-sectional view of a modification of the semiconductor chip element 100, as was described with reference to FIG. 6 or FIG. 8. FIG. 10 shows, corresponding to FIG. 8, a cross-sectional view after the formation of the back-bias magnet 700 and, if appropriate, singulation of the wafer. As compared to the embodiment according to FIG. 8, the apparatus with semiconductor chip element 100 according to FIG. 10 however additionally has respective magnetic lenses 800 between the formed structures of the contact surface of the semiconductor chip element 100 and the sensor element arranged thereabove. Magnetic lenses can be formed for example by what is referred to as flux concentrators or flux concentrator layers. Magnetic lenses can in a simple case be realized for example using a wire loop with at least one winding or with the additional use of iron cores. It is possible using a magnetic lens 800 for the strength of a magnetic field 350 to be increased by more than one order of magnitude, and it is thus possible for the measurement sensitivity and/or accuracy of the sensor 200 to be likewise increased, wherein additionally effective parallelization of the magnetic field 350 in the region of the sensor 200 can be achieved.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of magnetic sensor packages including an integral cast permanent magnet as discussed herein. Therefore, it is intended that this invention be limited only by the claims and the equivalents thereof.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An apparatus, comprising
a back-bias magnet;
a semiconductor chip element; and
a magnetic lens configured to amplify the magnetic field lines generated by the back-bias magnet;
wherein the semiconductor chip element has a sensor for measuring a magnetic field strength; and
wherein a contact surface is formed on a contact side of the back-bias magnet and on a contact side of the semiconductor chip element and wherein the contact side of the semiconductor chip element has one or more structures such that the contact surface of the back-bias magnet is shaped in a manner corresponding to the structures of the semiconductor chip element, and
wherein the magnetic lens is arranged in the semiconductor chip element.

2. The apparatus as claimed in claim 1, wherein the contact surface of the back-bias magnet is shaped in a manner corresponding to the structures of the semiconductor chip element and the semiconductor chip element and the back-bias magnet are thereby fixedly connected to each other at the contact surface.

3. The apparatus as claimed in claim 1, wherein the structures of the semiconductor chip element are formed by etching.

4. The apparatus as claimed in claim 1, wherein the back-bias magnet has a magnetized material.

5. The apparatus as claimed in claim 4, wherein the magnetizable material has at least one of the following: permanent-magnetic particles; soft magnetic particles; and hard magnetic particles.

6. The apparatus as claimed in claim 1, wherein magnetic field lines generated by the back-bias magnet are settable by shaping the structures of the semiconductor chip element.

7. The apparatus as claimed in claim 1, further comprising: contact elements in electrical connection with the semiconductor chip element.

8. The apparatus as claimed in claim 7, wherein the semiconductor chip element is contacted using wire bonds or solder beads.

9. The apparatus as claimed in claim 1, wherein the sensor comprises at least one of a GMR sensor; a Hall sensor; a magnetic resistance; a giant magnetic resistance; and an anisotropic magnetic resistance.

10. A method for producing an apparatus, the method comprising:
providing a semiconductor chip element, wherein the semiconductor chip element comprises a sensor for measuring a magnetic field strength;
forming one or more structures on a contact side of the semiconductor chip element; and
generating a back-bias magnet such that a contact surface is formed on a contact side of the back-bias magnet and on a contact side of the semiconductor chip element such that the contact surface of the back-bias magnet is shaped in a manner corresponding to the structures of the semiconductor chip element;
wherein a magnetic lens is arranged in the semiconductor chip element between the sensor and the one or more structures.

11. The method as claimed in claim 10, wherein the generating the back-bias magnet comprises the injection of compound onto the contact side of the semiconductor chip element.

12. The method as claimed in claim 10, further comprising: singulating the semiconductor chip element.

13. The method as claimed in claim 10, further comprising: producing the one or more structures by removing material on a contact side of the semiconductor chip element.

14. The method as claimed in claim 13, wherein, together with the removal of material, a further structure for defining a singulation edge is produced.

15. The method as claimed in claim 10, wherein a structure for defining the singulation is formed at least partially by the one or more structures on the contact side of the semiconductor chip element.

* * * * *